(12) United States Patent
Huang et al.

(10) Patent No.: US 11,810,965 B2
(45) Date of Patent: Nov. 7, 2023

(54) FIN SEMICONDUCTOR DEVICE AND METHOD FOR MAKING THE SAME

(71) Applicant: SHANGHAI HUALI INTEGRATED CIRCUIT CORPORATION, Shanghai (CN)

(72) Inventors: Qiuming Huang, Shanghai (CN); Jun Tan, Shanghai (CN); Qiang Yan, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 265 days.

(21) Appl. No.: 17/327,571

(22) Filed: May 21, 2021

(65) Prior Publication Data
US 2021/0376128 A1 Dec. 2, 2021

(30) Foreign Application Priority Data
May 29, 2020 (CN) .......................... 202010474867.6

(51) Int. Cl.
*H01L 29/66* (2006.01)
*H01L 21/02* (2006.01)
*H01L 29/06* (2006.01)
*H01L 29/423* (2006.01)
*H01L 29/786* (2006.01)

(52) U.S. Cl.
CPC .... *H01L 29/66742* (2013.01); *H01L 21/0259* (2013.01); *H01L 21/02236* (2013.01); *H01L 29/0665* (2013.01); *H01L 29/42392* (2013.01); *H01L 29/78696* (2013.01)

(58) Field of Classification Search
CPC ......... H01L 29/66742; H01L 21/02236; H01L 21/0259; H01L 29/0665; H01L 29/42392; H01L 29/78696; H01L 29/66439; H01L 29/775; H01L 29/0673; H01L 29/66795; H01L 29/0607; H01L 29/1033; H01L 29/42356; H01L 29/785; B82Y 10/00
See application file for complete search history.

(56) References Cited

U.S. PATENT DOCUMENTS

| | | | |
|---|---|---|---|
| 2013/0323911 A1* | 12/2013 | Cho | H01L 29/66795 438/478 |
| 2015/0263134 A1* | 9/2015 | Lee | H01L 29/78696 438/151 |
| 2017/0133277 A1* | 5/2017 | Kim | H01L 21/8238 |
| 2019/0157411 A1* | 5/2019 | Cappellani | H01L 29/7848 |

\* cited by examiner

*Primary Examiner* — Mark W Tornow
*Assistant Examiner* — David Paul Sedorook
(74) *Attorney, Agent, or Firm* — Alston & Bird LLP

(57) ABSTRACT

A manufacturing method of a fin semiconductor device comprises: providing a substrate, wherein a fin channel base is patterned on and in contact with the substrate; epitaxially growing a top part of the fin channel base and extending the top part of the fin channel base sideways and upward to form a fin channel core; oxidizing the fin channel base to form a fin channel structure, wherein the fin channel structure comprises the fin channel core surrounded with an oxide layer at the top part of the fin channel base and an intermediate part of the fin channel base under the top part; and removing the oxide layer to expose the fin channel core, wherein the fin channel core suspends over the substrate.

8 Claims, 5 Drawing Sheets

FIN SEMICONDUCTOR DEVICE AND METHOD FOR MAKING THE SAME

CROSS-REFERENCES TO RELATED APPLICATIONS

This application claims priority to Chinese patent application No. CN202010474867.6, filed on May 29, 2020, and entitled "FIN SEMICONDUCTOR DEVICE AND METHOD FOR MAKING THE SAME", the disclosure of which is incorporated herein by reference in its entirety.

TECHNICAL FIELD

The present application relates to the field of semiconductor devices and manufacturing, in particular, to a fin semiconductor device and a manufacturing method thereof.

BACKGROUND

Since the early days when Dr. Jack Kilby of Texas Instruments invented the integrated circuits, scientists and engineers have made numerous inventions and improvements in all aspects of semiconductor devices and processes. The sizes of semiconductor devices have been significantly reduced in the past 50 years, thanks to continuous increases in processing speeds and continuous reductions in power consumption. The development of semiconductor devices has consistently followed the Moore's Law up to this now. Moore's Law perceives that the number of transistors in a microchip doubles approximately every two years though the cost of computers is halved. Currently, the semiconductor process is developing towards a node below 20 nm, and people are working on the 14-nm process. A reference is provided herein, the diameter of a silicon atom is about 0.2 nm, which means that the distance between two components at two ends of a pitch manufactured by means of the 20-nm process is only about the sum of the diameters of a hundred silicon atoms. Therefore, manufacturing of semiconductor devices has become increasingly challenging approaching towards the feasible physical limit.

With development of integrated circuits, device sizes have become increasingly small, meanwhile the integration level has become increasingly high. Continuous decrease of the critical dimensions of semiconductor devices has challenged the conventional planar semiconductor manufacturing technologies to be inapplicable, therefore non-planar technologies have emerged in the semiconductor devices and processes, for example, new processes such as silicon-on-insulator, double-gate, multi-gate, and 3D devices have occurred. Recently, the fin field-effect transistors (FinFET) have been fabricated in the field of small-sized devices, and also devices having gate-all-around structures are also pursued by the semiconductor industry because of their unique performance in suppressing the short channel effect effectively. As a gate-all-around device channel is surrounded by the gate, the impact of the short channel effect is eliminated. In addition, the device's electric leakage and punch-through issues are effectively suppressed. The manufacturing process of the gate-all-around device is relatively complicated because the gate is suspended over the bottom substrate.

In view the above, there is an urgent need for a method for manufacturing a fin semiconductor device, whereby a suspended fin channel can be formed via a simpler technical process than the existing one, and thereby forming a suspended gate-all-around gate over the bottom substrate, so as to improve the device performance, reduce the process complexity, and control the manufacturing cost.

BRIEF SUMMARY

A brief overview of one or more aspects is provided below to provide a basic understanding of the disclosure. The overview is not detailed and comprehensive for all the conceived embodiments. It is neither intended to identify the key or decisive elements of all the aspects, nor attempted to define the scope of any or all of the details of the embodiments. The sole purpose here is to present some concepts of one or more aspects in a simplified form as a prelude to the more detailed description provided subsequently.

One embodiment of the present application provides a method for manufacturing the fin semiconductor device, comprising steps of: providing a substrate, wherein a fin channel base is patterned on and in contact with the substrate; epitaxially growing a top part of the fin channel base and extending the top part of the fin channel base sideways and upward to form a fin channel core; oxidizing the fin channel base to form a fin channel structure, wherein the fin channel structure comprises the fin channel core surrounded with an oxide layer at the top part of the fin channel base and an intermediate part of the fin channel base under the top part; and removing the oxide layer to expose the fin channel core, wherein the fin channel core suspends over the substrate.

In some examples, the epitaxially growing the top part of the fin channel base further comprises steps of: forming a first barrier layer at two sides of the fin channel base on the substrate, wherein a top surface of the first barrier layer is lower than a top surface of the fin channel base; forming a second barrier layer on the first barrier layer, wherein a top surface of the second barrier layer is above the top surface of the fin channel base, wherein a gap is provided between the second barrier layer and each side of the fin channel base; and performing, on the first barrier layer, the epitaxial growth of the top part of the fin channel base in the gap by using the second barrier layer as side walls, to extend the top part of the fin channel base sideways and upward.

In some examples, the first barrier layer is a first portion of a first dielectric layer, wherein the first dielectric layer comprises a second portion disposed around the fin channel base, and wherein the second portion is a protrusion above the first barrier layer; wherein the forming the second barrier layer comprises steps of: depositing a second dielectric layer on the first dielectric layer; patterning and etching the second dielectric layer over the protrusion to form the second barrier layer; and removing the protrusion from the second barrier layer to form the gap between the sidewalls of the second barrier layer and the fin channel base.

In some examples, the performing, on the first barrier layer, epitaxial growth of the top part of the fin channel base in the gap by using the second barrier layer as the side walls comprises steps of: performing, on the first barrier layer, the epitaxial growth of the top part of the fin channel base by using the second barrier layer as the side walls, wherein the top part of the fin channel base fills up the gap, and wherein a top surface of the fin channel base is above the top surface of the second barrier layer; and planarizing the fin channel base by using the second barrier layer as a stop layer, wherein the top surface of the fin channel base is flush with the top surface of the second barrier layer.

In some examples, oxidizing the fin channel base to form the fin channel structure comprises steps of: removing the second barrier layer; removing the top part of the first barrier layer to expose the intermediate part of the fin channel base under the top part of the fin channel base; and oxidizing at least the intermediate part of the fin channel base.

In some examples, the first barrier layer comprises silicon oxide; and/or wherein the second barrier layer comprises silicon nitride.

In some examples, the fin channel base comprises monocrystalline silicon.

In some examples, the method further comprising: sequentially forming a gate dielectric layer on the fin channel core and a gate layer on the gate dielectric layer to form a gate-all-around structure.

In some examples, the gate dielectric layer comprises a high-dielectric-constant material; and/or wherein the gate layer comprises a metal gate material.

According to another embodiment, a fin semiconductor device is provide, comprising a substrate and a fin structure on the substrate, wherein the fin structure comprises a fin source, a fin drain, and a suspended fin channel connecting to the fin source and the fin drain, wherein a top surface of the fin structure is above a top surface of the substrate; wherein the suspended fin channel is disposed over the substrate; wherein a gate-all-around structure is formed around the suspended fin channel; and wherein the suspended fin channel is formed by the method of manufacturing described above.

In the method for manufacturing a fin semiconductor device provided in one aspect of the present application, a fin channel suspended over a substrate can be formed via a simple process, to facilitate the formation of a gate-all-around structure in a subsequent process, thereby improving the performance of the fin field-effect transistor. In addition, the manufacturing method provided by the present application has a simple technical process and no additional manufacturing cost. The fin semiconductor device provided in another aspect of the present application has a fin channel suspended over a bottom substrate and an all-around gate covering the suspended fin channel, effectively suppressing the short channel effect, effectively solving the electric leakage and punch-through problems, and thereby having relatively well device performance.

BRIEF DESCRIPTION OF THE DRAWINGS

By reading the detailed description of the embodiments of the present disclosure with reference to the following drawings, the above-mentioned features and advantages of the present application can be better understood. In the drawings, various components are not necessarily drawn to scale, and components with similar related characteristics or features may have the same or similar reference numerals.

DETAILED DESCRIPTION OF THE DISCLOSURE

Figure 1:
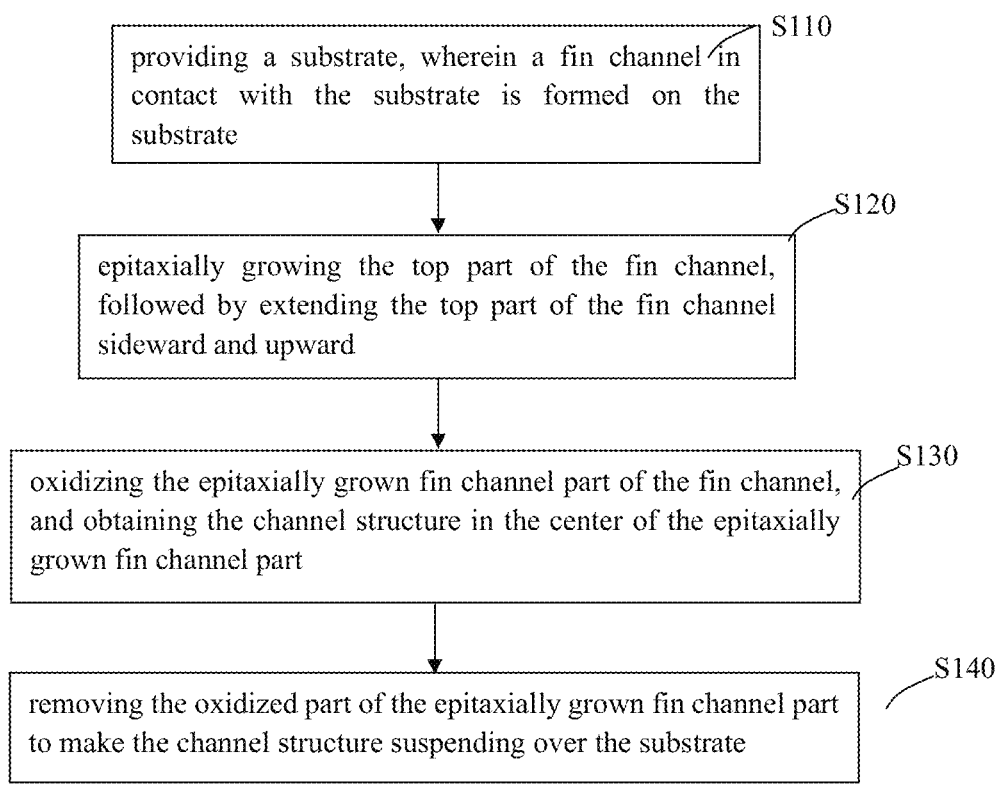
FIG. 1 illustrates a flowchart of a method for manufacturing a fin semiconductor device according to one embodiment of the present disclosure.

The present application is described in detail below with reference to the drawings and specific embodiments. It should be noted that the following aspects described with reference to the drawings and specific embodiments are merely some examples and should not be construed as any limitation on the protection scope of the present application.

The present application relates to a fin semiconductor device and a manufacturing process thereof. More specifically, embodiments of the present application provide a manufacturing process of a fin semiconductor device. In the method for manufacturing a fin semiconductor device provided in one aspect of the present application, a fin channel suspended over a bottom substrate can be formed via a simple process, to facilitate the formation of an all-around gate in a subsequent process, thereby improving the performance of the fin field-effect transistor. In addition, the manufacturing method provided by the present application has a simple technical process and no additional manufacturing cost. The fin semiconductor device provided in another aspect of the present application has a fin channel suspended over a bottom substrate and an all-around gate covering the suspended fin channel, effectively suppressing the short channel effect, effectively solving the electric leakage and punch-through problems, and thereby having relatively well device performance.

The following description is provided to enable those skilled in the art to implement and use the present application and incorporate it into specific application contexts. Various modifications and various uses in different applications are apparent to those skilled in the art, and the general principles defined herein can be applied to a wide range of embodiments. Therefore, the present application is not limited to the embodiments provided herein, but should be granted the broadest scope consistent with the principles and novel features disclosed herein.

In the following detailed description, many specific details are set forth to provide a more thorough understanding of the present application. However, it is obvious to those skilled in the art that the practice of the present application may not necessarily be limited to these specific details. In other words, the well-known structures and devices are shown in block diagram forms and are not shown in detail, so as to avoid obscuring the present application.

Readers should be noted that all files and documents submitted with this specification and open to the public to consult this specification, and the contents of all of the files and documents are incorporated herein by reference. Unless otherwise stated directly, all the features disclosed in this specification (including any appended claims, abstract, and drawings) can be replaced by alternative features for achieving the same, equivalent, or similar purpose. Therefore, unless otherwise stated expressly, each feature disclosed is only an example of a set of equivalent or similar features.

It should be noted that when used, the left, right, front, rear, top, bottom, head, tail, clockwise, and counterclockwise signs are used for convenience only, and do not imply any specific direction. In fact, they are used to reflect the relative position and/or orientation between various parts of an object.

As used herein, the terms "over", "under", "between", and "on" refer to a relative position of one layer relative to another layer. Likewise, for example, a layer deposited or placed over or under another layer may directly contact the other layer or may be separated from the other layer by one or more intermediate layers. Moreover, a layer deposited or placed between layers may directly contact the layers or may be separated from the layers by one or more intermediate layers. In contrast, a first layer "on" a second layer is in contact with the second layer. In addition, a relative position of one layer relative to the other layers is provided (assuming that deposition, modification, and film removal operations are performed relative to a base substrate, regardless of the absolute orientation of the substrate).

As stated above, in order to manufacture a fin field-effect transistor having a suspended fin channel and an all-around gate covering the suspended fin channel, one embodiment of the present application provides a manufacturing method as illustrated in FIG. 1. Specifically, the method includes: step S110: providing a substrate, wherein a fin channel in contact with the substrate is formed on the substrate; step S120: epitaxially growing the top part of the fin channel, followed by extending the top part of the fin channel sideways and upward; step S130: oxidizing the epitaxially grown fin channel part, thus obtaining the channel structure in the center of the epitaxially grown fin channel part; and step S140: removing the oxidized fin channel, to suspend the channel structure over the substrate.

In step S110, the substrate is composed of a substrate material, including but not limited to monocrystalline silicon. The fin channel is formed on the substrate by patterning a wall-like structure protruding from the substrate as the fin channel. In another embodiment, the fin channel can also be obtained by first depositing a channel layer on the substrate and then patterning the channel layer to form the fin. The specific mode of forming the fin channel on the substrate should not inappropriately limit the protection scope of the present application.

In another embodiment, a fin source and a fin drain are both formed in contact with the substrate, and the suspended fin channel connects the fin source and the fin drain. The fin source and the fin drain can be formed in the same steps of forming the fin channel.

In the embodiment, the step S120, i.e., the epitaxially growing the top part of the fin channel further includes steps of: on the substrate forming at two ends of the fin channel, a first barrier layer lower than the fin channel; forming, on the first barrier layer, a second barrier layer higher than the fin channel, wherein a gap is provided between the fin channel and the second barrier layer at each side; and performing, on the first barrier layer, epitaxial growth of the fin channel by using the second barrier layer as a side wall, to extend the top part of the fin channel sideways and upward.

In one aspect of the embodiment, forming a first barrier layer may include: depositing a first dielectric layer on the top surface of the substrate and all around the fin channel, herein the first barrier layer composes the portion of the first dielectric layer on the substrate and lower than the fin channel, and the other portion surrounding the fin channel protrudes from the first dielectric layer. Specifically, in an embodiment, the first dielectric layer is composed of a silicon oxide material, so that the first barrier layer is composed of the silicon oxide material.

In another aspect of the embodiment, forming a second barrier layer includes the steps of: depositing a second dielectric layer covering the first dielectric layer; patterning and etching the second dielectric layer over the protrusion to form the second barrier layer; and removing the protrusion by means of the second barrier layer to form the gap between the second barrier layer and the fin channel. Specifically, in an embodiment, the second dielectric layer is composed of a silicon nitride material, so that the formed second barrier layer is composed of the silicon nitride material.

In another aspect of the embodiment, performing, on the first barrier layer, epitaxial growth of the fin channel by using the second barrier layer as a side wall includes steps of: performing epitaxial growth of the fin channel on the first barrier layer by using the second barrier layer as a side wall, so that the top part of the fin channel is set higher than the second barrier layer and fills up the gap between the second barrier layer and the fin channel; and then planarizing the fin channel layer as the second barrier layer acts as a stop layer, so that the upper surface of the fin channel is flush with the upper surface of the second barrier layer. The part of the fin channel located above the second barrier layer is epitaxially grown to fill up the gap of the epitaxial fin channel. The epitaxial fin channel located above the second barrier layer is planarized to ensure that the epitaxial fin channels of all the fin semiconductor devices in different device regions are set at the same level. Therefore, the problem of uneven fin structures from different epitaxial growth speeds at high device density or sparse density regions on the same substrate is resolved.

In another aspect of the embodiment, the step S130, i.e., the oxidizing the epitaxially grown fin channel, includes the steps of: removing the second barrier layer; removing the top part of the first barrier layer to expose an intermediate part of the fin channel under the epitaxially grown fin channel part; and oxidizing at least the intermediate part of the fin channel.

After the above steps, the top fin channel can be suspended. In an embodiment, the manufacturing method provided in one aspect of the present application further includes sequentially depositing a gate dielectric layer and a gate layer around the top fin channel suspended over the substrate, to form an all-around gate structure. The gate dielectric layer is composed of gate dielectric materials, including but not limited to an oxide or a high-dielectric constant material. The gate layer is composed of gate materials, including but not limited to metal tungsten or polysilicon.

Reference is further made to FIGS. 2A, 2B, and 3-11 to disclose the manufacturing method according to one embodiment of the present application. FIGS. 2A, 2B, and 3-11 illustrate schematic structural diagrams in a process of manufacturing the fin semiconductor device.

Figure 2A:
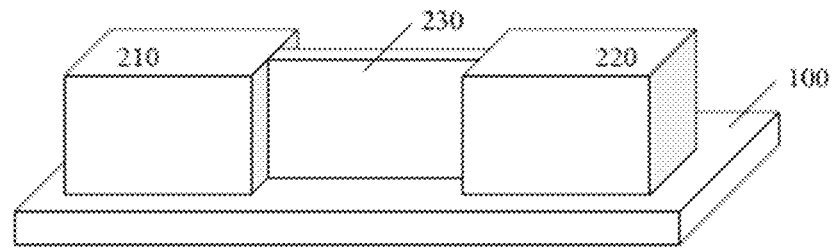
FIGS. 2A, 2B, and 3-11 illustrate schematic structural diagrams in a process of manufacturing the fin semiconductor device according to one embodiment of the present disclosure.
Figure 2B:
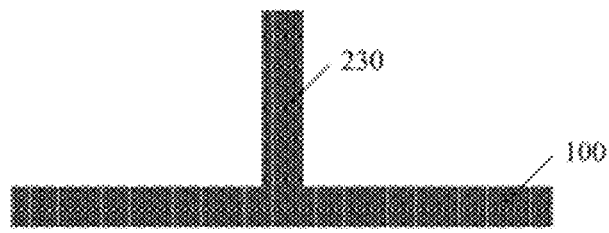

First, referring to FIGS. 2A and 2B. FIG. 2A illustrates a substrate 100, a fin source 210 and a fine drain 220 disposed on the substrate, and the fin channel 230 disposed on the substrate and connecting the fin source 210 and the fine drain 220. FIG. 2B illustrates a cross sectional view of the structure of substrate 100 and the fin channel 230.

It In an embodiment, the fin source 210, the fin drain 220, and the fin channel 230 can be formed in the same steps. The substrate is patterned to form the fin source 210, the fin drain 220, and the fin channel 230, protruding upward out of the substrate 100. It should be noted that the specific mode of forming the fin source 210, the fin drain 220, and the fin channel 230 on the substrate should not inappropriately limit the protection scope of the present application. The materials of the fin source 210, fin drain 220, and fin channel 230 are the same as that of the substrate 100. In an embodiment, the substrate 100 is composed of a substrate material, including but not limited to monocrystalline silicon.

Figure 3:
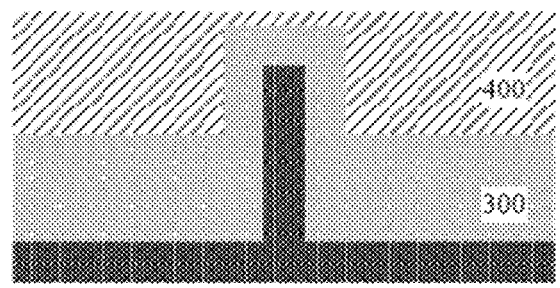

FIG. 3 illustrates the structure having a first dielectric layer 300 disposed on the fin channel 230 and the substrate 100, and a second dielectric layer 400 disposed on the first dielectric layer 300. In FIG. 3, the first dielectric layer 300 on the substrate 100 has a level lower than the level on top of the fin channel 230. The part of the first dielectric layer 300 on the fin channel 230 protrudes out. The second dielectric layer 400 is disposed on the first dielectric layer 300.

In the above embodiment, the first dielectric layer 300 and the second dielectric layer 400 can be formed by means of a number of deposition techniques. Further, the material of the first dielectric layer 300 is an oxide, and the material of the second dielectric layer 400 is a nitride.

Figure 4:
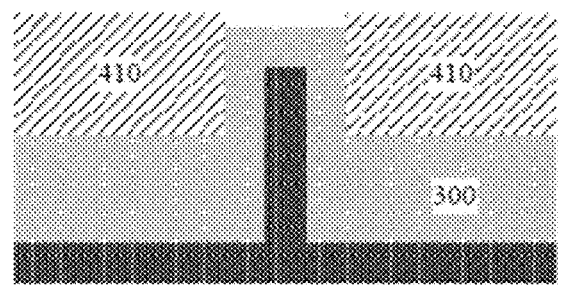
Figure 5:
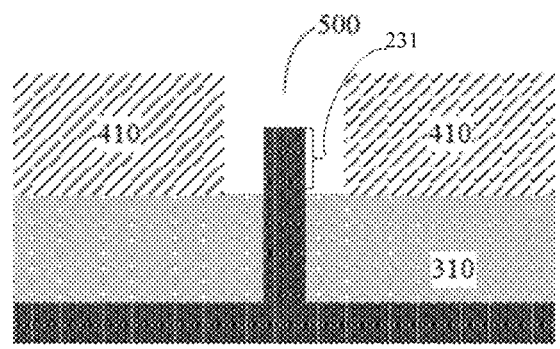

FIGS. 4 and 5 illustrates a structure obtained after patterning and etching the second dielectric layer 400 over the protrusion of the first dielectric layer 300. By patterning and etching the second dielectric layer 400, the protrusion of the first dielectric layer 300 can be exposed again. Moreover, patterning and etching the second dielectric layer 400 generates the second barrier layer 410 at two sidewalls of the top portion 231 of the fin channel 230, here the second barrier layer 410 and the top portion of the fin channel 230 are separated from each by gaps, and the top surface of the second barrier layer 410 is above the top of the fin channel 230.

FIG. 5 illustrates the structure obtained after the protrusion of the first dielectric layer 300 is etched and removed next to the second barrier layer 410. By removing the protrusion of the first dielectric layer 300 between the second barrier layer 410 and the top portion of the fin channel 230, the remaining first dielectric layer, i.e., the first barrier layer 310 is on the substrate 100, and the surface of the first barrier layer 310 is lower than the top surface of the fin channel 231. Moreover, by removing the protrusion of the first dielectric layer 300, the top of the fin channel 231 can be exposed again, and the gap 500 can be formed between the second barrier layer 410 and the top portion of the fin channel 231.

Figure 6:
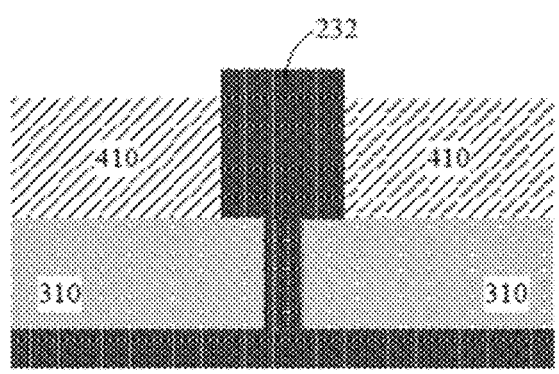

FIG. 6 illustrates the structure obtained after the epitaxial growth on the top part 231 of the fin channel 230. Referring to FIG. 6, on the upper surface of the first barrier layer 310, the exposed (in FIG. 5) top part 231 of the fin channel 230 is epitaxially grown by using the second barrier layer 410 as side walls, so that the top part 231 of the original fin channel 230 extends sideways and upward to form an epitaxially grown fin channel 232.

In some examples, referring to FIG. 6, the epitaxially grown fin channel 232 fills up the entire gap 500 in FIG. 5, and the top surface of the epitaxially grown fin channel 232 is above the top surface of the second barrier layer 410.

Figure 7:
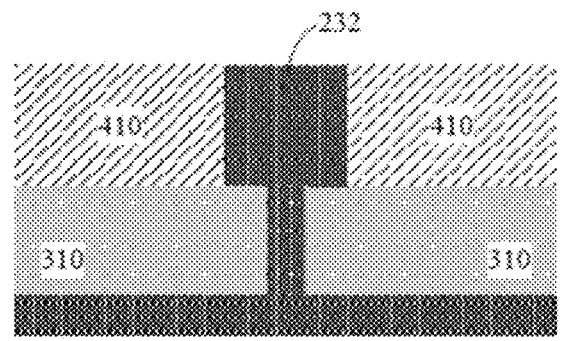

FIG. 7 illustrates the structure obtained after planarizing the second barrier layer 410 to be flush as the surface of the epitaxially grown fin channel 232. Referring to FIG. 7, the second barrier layer 410 acts as a stop layer during polishing, so that the upper surface of the epitaxially grown fin channel 232 can be flush with the upper surface of the second barrier layer 410. The upper surface of the epitaxially grown fin channel 232 can be planarized with a number of polishing techniques.

When performing epitaxial depositing the fin channel 232 layer down into the gap 500, typically the epitaxial material will fill the gap above the top level of the second barrier layer 410. Therefore, a planarization step has to be taken to remove the extra material in the fin channel 232 to ensure that the top surfaces of different fin channels in different device regions are at the same level. Therefore, the problem of uneven fin structures from different epitaxial growth speeds at high device density or sparse density regions on the same substrate is mitigated.

Figure 8:
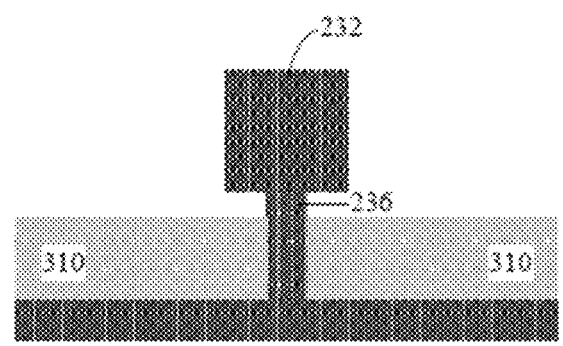

FIG. 8 illustrates the structure obtained after the second barrier layer 410 is removed and the first barrier layer 310 is partially removed. Referring to FIG. 8, an intermediate fin channel 236 connected to the epitaxially grown fin channel 232 is exposed after the upper part of the first barrier layer 310 is thinned down, that is, neither the epitaxially grown top part of the fin channel 232 nor the intermediate fin channel 236 is covered by any of the barrier layers, and the fin channel 232 and the intermediate fin channel 236 can be oxidized in a subsequent oxidation process.

Figure 9:
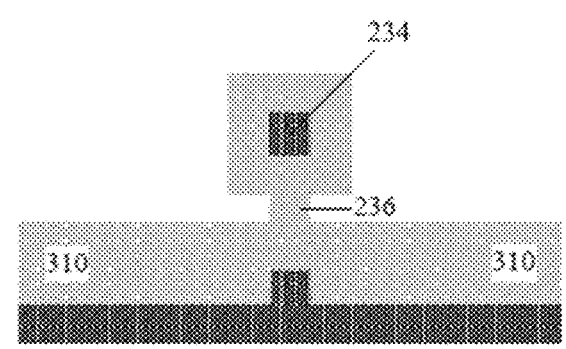

FIG. 9 illustrates the structure obtained after oxidation of the epitaxially grown fin channel 232 and the intermediate fin channel 236. It can be understood that, since the epitaxially grown fin channel 232 extends sideways and upward from the first made fin channel structure, to extend the dimension of the fin channel 232. When the lateral dimension of the epitaxially grown fin channel 232 becomes larger than the lateral dimension of the intermediate fin channel 236, the intermediate fin channel 236 can be oxidized all around by applying a long oxidation time. It must be ensured that the epitaxially grown fin channel 232 is not all oxidized, only an outer layer of the epitaxially grown fin channel 232 is oxidized and a central portion of the fin channel 232 remains epitaxially grown crystalline silicon, and subsequently serves as the suspended core fin channel 234.

The dimensions of the core fin channel 234 can be adjusted by adjusting the duration of the oxidation process in the above steps. In addition, the dimensions of the remaining core fin channel 234 is also associated with the dimensions of the epitaxially grown fin channel 232. The dimensions of the epitaxially grown fin channel 232 are associated with the dimensions of the gap 500, and the dimensions of the gap 500 are associated with the dimensions of the protrusion of the first dielectric layer 300. That is, in the step of forming the first dielectric layer 300, the dimensions of the top fin channel 234 remaining subsequently can be adjusted by controlling the thickness of the protruded film covering the fin channel.

Figure 10:
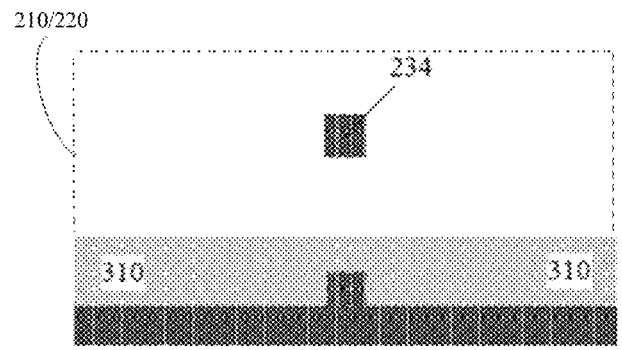

FIG. 10 illustrates the structure formed after removing the oxidized intermediate fin channel 236 and the oxidized peripheral portion of the epitaxially grown fin channel 232. Because the first barrier layer 310 is composed of an oxide material, the upper part of the first barrier layer 310 is also removed in this step. After the oxidized intermediate fin channel 236 and peripheral oxidized portion of the epitaxially grown fin channel 232 are gone, the core fin channel 234 with two ends is formed suspending over the substrate 100. The two ends of the suspended fin channel 234 are connected to the fin source 210 and the fin drain 220, one of them is represented by the dashed rectangular block behind the fin channel 234. At the same time the fin source 210 and the fin drain 220 also provide support points for the suspended core fin channel 234.

Figure 11:
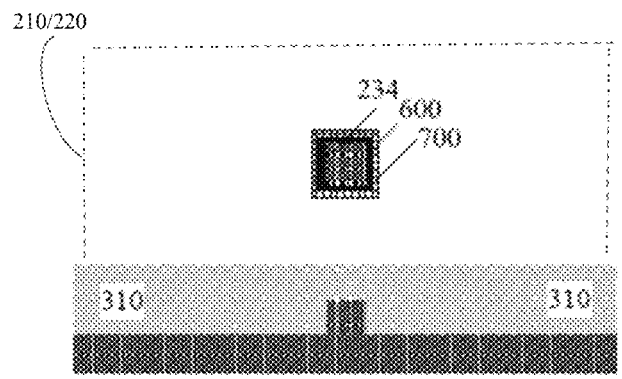

FIG. 11 illustrates an all-around gate structure after making the suspended core fin channel 234, sequentially a gate dielectric layer 600 and a gate layer 700 are deposited around the surface of the core fin channel 234. The gate dielectric layer 600 is composed of a gate dielectric material, including but not limited to an oxide or a high-dielectric constant material. The gate layer 700 is composed of a gate material, including but not limited to metal tungsten or polysilicon.

The method for manufacturing a fin semiconductor device according to one embodiment of the present disclosure has been described above. This manufacturing method discloses a relatively simple technical process with no additional manufacturing cost. A fin channel suspended over a substrate is formed via the disclosed technical process, to realize the all-around gate in a subsequent process, which then improves the performance of the fin field-effect transistor.

Figure 12:
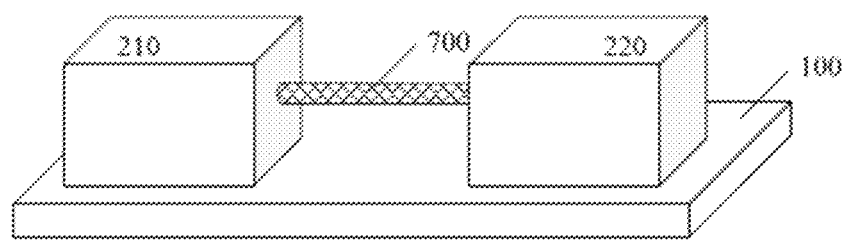
FIG. 12 illustrates a perspective view of another fin semiconductor device according to an embodiment of the present disclosure.

Another embodiment of the present disclosure provides a fin semiconductor device formed according to the manufacturing method descried above. Reference is made to FIG. 12 to disclose the fin semiconductor structure provided in another embodiment of the present application. Referring to FIG. 12, the fin semiconductor device includes a substrate 100 and a fin structure above the surface of the substrate 100. The fin structure includes a fin source 210, a fin drain 220, and a fin channel connecting to the fin source 210 and the fin drain 220. The fin channel is a suspended one over the substrate 100. An all-around gate structure is formed around the suspended channel, the gate channel is surrounded by a gate dielectric layer 600, and a gate layer 700 is coated surrounding the gate dielectric layer 600, as shown in FIGS. 11 and 12.

The fin semiconductor device according to the embodiment of the present application has a fin channel suspended over a substrate and an all-around gate disposed around the suspended fin channel. This structure effectively suppresses the short channel effect, effectively solves the electric leakage and punch-through problems, thereby having relatively good device performance.

The fin semiconductor device and the manufacturing method thereof have been described in detail. According to the method for manufacturing the fin semiconductor device in one embodiment of the present application, a fin channel is made to suspend over a substrate via a relatively simple process, the all-around gate is formed in a subsequent process. In addition, no additional cost is induced by the manufacturing method because of the simplicity of the technical process. According to another embodiment of the present invention, a fin semiconductor device is provided, the fin semiconductor has a fin channel suspended over a substrate and an all-around gate disposed around the suspended fin channel. This device effectively suppresses the short channel effect, mitigates the electric leakage and punch-through problems, thereby improving device performance.

Although the present disclosure is described with respect to exemplary embodiments, it is obvious that various modifications and changes can be made to these embodiments without departing from the broader spirit and scope of the present disclosure. Therefore, the specification and drawings should be construed as being illustrative rather than restrictive.

It should be understood that this specification will not be used to interpret or limit the scope or meaning of the claims. In addition, in the foregoing detailed description, it can be seen that various features are combined together in a single embodiment for the purpose of simplifying the present disclosure. The method of the present disclosure should not be construed as reflecting that the claimed embodiments require more features than those explicitly listed in each claim. On the contrary, as reflected in the appended claims, the inventive subject matter includes features less than all the features of a single disclosed embodiment. Therefore, the appended claims are hereby incorporated into the detailed description, with each claim independently used as an independent embodiment.

An embodiment or embodiments mentioned in the description are intended to be included in at least one embodiment of a device or a method in combination with the specific features, structures, or characteristics described in the embodiment. The phrase "one embodiment" in various portions of the specification does not necessarily refer to the same embodiment.

What is claimed is:

1. A method for manufacturing a fin semiconductor device, comprising steps of:
providing a substrate, wherein a fin channel base is patterned on and in contact with the substrate;
epitaxially growing a top part of the fin channel base and extending the top part of the fin channel base sideways and upward to form a fin channel core;
forming a first barrier layer at two sides of the fin channel base on the substrate, wherein a top surface of the first barrier layer is lower than a top surface of the fin channel base;
forming a second barrier layer on the first barrier layer, wherein a top surface of the second barrier layer is above the top surface of the fin channel base, wherein a gap is provided between the second barrier layer and each side of the fin channel base;
performing, on the first barrier layer, the epitaxial growth of the top part of the fin channel base in the gap by using the second barrier layer as side walls, to extend the top part of the fin channel base sideways and upward;
oxidizing the fin channel base to form a fin channel structure, wherein the fin channel structure comprises the fin channel core surrounded with an oxide layer at the top part of the fin channel base and an intermediate part of the fin channel base under the top part; and
removing the oxide layer to expose the fin channel core, wherein the fin channel core suspends over the substrate.

2. The method according to claim 1, wherein the first barrier layer is a first portion of a first dielectric layer, wherein the first dielectric layer comprises a second portion disposed around the fin channel base, and wherein the second portion is a protrusion above the first barrier layer; wherein the forming the second barrier layer comprises steps of:
depositing a second dielectric layer on the first dielectric layer;
patterning and etching the second dielectric layer over the protrusion to form the second barrier layer; and
removing the protrusion from the second barrier layer to form the gap between the sidewalls of the second barrier layer and the fin channel base.

3. The method according to claim 1, wherein the performing, on the first barrier layer, epitaxial growth of the top part of the fin channel base in the gap by using the second barrier layer as the side walls comprises steps of:
performing, on the first barrier layer, the epitaxial growth of the top part of the fin channel base by using the second barrier layer as the side walls, wherein the top part of the fin top surface of the second barrier layer; and
planarizing the fin channel base by using the second barrier layer as a stop layer, wherein the top surface of the fin channel base is flush with the top surface of the second barrier layer.

4. The method according to claim 1, wherein the oxidizing the fin channel base to form the fin channel structure comprises steps of:
removing the second barrier layer;
removing the top part of the first barrier layer to expose the intermediate part of the fin channel base under the top part of the fin channel base; and
oxidizing at least the intermediate part of the fin channel base.

5. The method according to claim 1, wherein the first barrier layer comprises silicon oxide;
and/or
wherein the second barrier layer comprises silicon nitride.

6. The method according to claim 1, wherein the fin channel base comprises monocrystalline silicon.

7. The method according to claim 1, further comprising:
sequentially forming a gate dielectric layer on the fin channel core and a gate layer on the gate dielectric layer to form a gate-all-around structure.

8. The method according to claim 7, wherein the gate dielectric layer comprises a high-dielectric-constant material; and/or
wherein the gate layer comprises a metal gate material.

* * * * *